(12) United States Patent
Liu et al.

(10) Patent No.: US 12,228,616 B2
(45) Date of Patent: Feb. 18, 2025

(54) METHOD FOR DETECTING INTERNAL SHORT CIRCUIT OF BATTERY, ELECTRONIC APPARATUS, AND STORAGE MEDIUM

(71) Applicant: Dongguan NVT Technology Limited, Dongguan (CN)

(72) Inventors: Boyang Liu, Dongguan (CN); Xiaojie Tan, Dongguan (CN)

(73) Assignee: Dongguan NVT Technology Limited, Dongguan (CN)

(*) Notice: Subject to any disclaimer, the term of this patent is extended or adjusted under 35 U.S.C. 154(b) by 137 days.

(21) Appl. No.: 18/190,230

(22) Filed: Mar. 27, 2023

(65) Prior Publication Data
US 2023/0236253 A1 Jul. 27, 2023

Related U.S. Application Data

(63) Continuation of application No. PCT/CN2022/076687, filed on Feb. 17, 2022.

(30) Foreign Application Priority Data

Mar. 10, 2021 (CN) .......................... 202110260512.1

(51) Int. Cl.
*G01R 31/3842* (2019.01)
*G01R 31/389* (2019.01)
(Continued)

(52) U.S. Cl.
CPC ....... *G01R 31/3842* (2019.01); *G01R 31/389* (2019.01); *G01R 31/52* (2020.01); *H02J 7/0047* (2013.01)

(58) Field of Classification Search
None
See application file for complete search history.

(56) References Cited

U.S. PATENT DOCUMENTS

2019/0277919 A1* 9/2019 Takahara ............. G01R 31/367

FOREIGN PATENT DOCUMENTS

| CN | 104515954 A | 4/2015 |
|----|-------------|--------|
| CN | 109863416 A | 6/2019 |

(Continued)

OTHER PUBLICATIONS

First Office Action of CN Application No. 202110260512.1, mailed Jan. 30, 2022, 9 pages.

(Continued)

*Primary Examiner* — Jas A Sanghera
(74) *Attorney, Agent, or Firm* — Ladas & Parry LLP

(57) ABSTRACT

A method for detecting internal short circuit of a battery, includes: discharging a battery with a first current $I_1$ at a moment $t_1$; calculating a first discharge voltage drop $\Delta V_1$ of the battery at a moment $t_1+dt$; discharging the battery with a second current $I_2$ at a moment $t_2$, where $I_1 \neq I_2$; calculating a second discharge voltage drop $\Delta V_2$ of the battery at a moment $t_2+dt$; and determining, based on the first current $I_1$, the first discharge voltage drop $\Delta V_1$, the second current $I_2$, and the second discharge voltage drop $\Delta V_2$, whether the battery has an internal short circuit. In this application, whether the battery has an internal short circuit can be accurately determined, thereby ensuring safety of an electronic apparatus and a user.

10 Claims, 4 Drawing Sheets

(51) Int. Cl.
  *G01R 31/52* (2020.01)
  *H02J 7/00* (2006.01)

(56) References Cited

FOREIGN PATENT DOCUMENTS

| | | |
|---|---|---|
| CN | 110244230 A | 9/2019 |
| CN | 110506215 A | 11/2019 |
| CN | 110764014 A | 2/2020 |
| CN | 111142030 A | 5/2020 |
| CN | 111198327 A | 5/2020 |
| CN | 111257764 A | 6/2020 |
| CN | 111352039 A | 6/2020 |
| CN | 111624508 A | 9/2020 |
| CN | 111856316 A | 10/2020 |
| CN | 112834938 A | 5/2021 |
| JP | 2008305752 A | 12/2008 |
| JP | 2013246095 A | 12/2013 |
| JP | 2017106867 A | 6/2017 |
| TW | I636272 B | 9/2018 |

OTHER PUBLICATIONS

International Search Report for Application No. PCT/CN2022/076687, mailed May 17, 2022, 5 pages.
Zhang, Mingxuan, "Study of Short Circuit Problems in Batteries of Automobile Power Systems", Electronic Journal of Doctoral Degree Dissertations, No. 4, pp. 67-85, Apr. 15, 2020, 22 pages.
Seungyun Han et al. "Electrical Analysis about internal short circuit using additional resistance in high energy lithium-ion battery" 2020 20th International Conference on Control, Automation and systems (ICCAS 2020), Oct. 16, 2020, pp. 496-498.

\* cited by examiner

METHOD FOR DETECTING INTERNAL SHORT CIRCUIT OF BATTERY, ELECTRONIC APPARATUS, AND STORAGE MEDIUM

CROSS REFERENCE TO RELATED APPLICATIONS

This application is a continuation of International Patent Application No. PCT/CN2022/076687, filed on Feb. 17, 2022, which claims priority from Chinese Patent Application No. 202110260512.1, filed on Mar. 10, 2021. The contents of the aforementioned patent applications are incorporated herein by reference in their entirety.

TECHNICAL FIELD

This application relates to the field of battery technologies, and in particular, to a method for detecting internal short circuit of a battery, an electronic apparatus, and a storage medium.

BACKGROUND

Safety of a battery system has always been concerned. Particularly, a battery failure, fire, or even explosion caused by internal short circuit of the battery may cause great damage to a user. Causes of internal short circuit in a lithium-ion battery include damage of a separator, impurity particles doping in a battery manufacturing process, dissolution and deposition of an electrode material, formation of dendrites due to lithium precipitation at an electrode, and the like. Internal short circuit of the battery caused by an internal factor of the battery is not significant in the beginning, but may become serious over time under continued normal use of the battery or an extreme condition. Therefore, in use of a portable electronic product, internal short circuit of a battery needs to be detected as early as possible and coped with in a timely manner, which is crucial in ensuring the safety of the user and the device.

SUMMARY

In view of this, a method for detecting internal short circuit of a battery, an electronic apparatus, and a storage medium need to be provided, to accurately determine whether the battery has an internal short circuit.

An embodiment of this application provides a method for detecting internal short circuit of a battery, where the method includes: discharging a battery with a first current $I_1$ at a moment $t_1$; calculating a first discharge voltage drop $\Delta V_1$ of the battery at a moment $t_1+dt$, where $\Delta V_1=V_0-V_1$, $V_0$ is a terminal voltage of the battery in a static state, and $V_1$ is a terminal voltage of the battery at the moment $t_1+dt$; discharging the battery with a 10 second current $I_2$ at a moment $t_2$, where $I_1 \neq I_2$; calculating a second discharge voltage drop $\Delta V_2$ of the battery at a moment $t_2+dt$, where $\Delta V_2=V_0-V_2$, and $V_2$ is a terminal voltage of the battery at the moment $t_2+dt$; and determining, based on the first current $I_1$, the first discharge voltage drop $\Delta V_1$, the second current $I_2$, and the second discharge voltage drop $\Delta V_2$, whether the battery has an internal short circuit.

According to some embodiments of this application, the method further includes: calculating a first ratio $dV_{Ratio}$ between the second discharge voltage drop $\Delta V_2$ and the first discharge voltage drop $\Delta V_1$ and a second ratio $dI_{Ratio}$ between the second current $I_2$ and the first current $I_1$; and if an absolute value of a difference between the first ratio $dV_{Ratio}$ and the second ratio $dI_{Ratio}$ is greater than a preset value, outputting alert information that the battery has an internal short circuit.

According to some embodiments of this application, the method further includes: if the battery has an internal short circuit, calculating a value of an internal short-circuit resistance of the battery.

According to some embodiments of this application, the calculating a value of an internal short-circuit resistance of the battery includes: establishing an equivalent circuit model of the battery, and determining a first voltage $V_1'$ of the battery in the equivalent circuit model; calculating a second voltage $V_2'$ over the internal short-circuit resistance in the equivalent circuit model; obtaining a discharge voltage drop equation based on the first voltage $V_1'$ and the second voltage $V_2'$; and calculating the value of the internal short-circuit resistance of the battery based on the discharge voltage drop equation.

According to some embodiments of this application, the first voltage $V_1'$ is determined through the following formula:

$V_1'=U_{oc}-(I+I_{ISC})\times r$, where $U_{oc}$ is an open-circuit voltage of the battery, $r$ is an internal resistance of the battery, $I_{ISC}$ is a current flowing through the internal short-circuit resistance, and $I$ is a current flowing through the internal resistance of the battery.

According to some embodiments of this application, the second voltage $V_2'$ is determined through the following formula:

$V_2'=I_{ISC}\times R_{ISC}$, where $R_{ISC}$ is the value of the internal short-circuit resistance.

According to some embodiments of this application, the discharge voltage drop equation is determined through the following formula:

$$\Delta V = (U_{oc} + I * R_{ISC})\frac{r}{r + R_{ISC}}$$

where $\Delta V=U_{oc}-V_1'$ and $V_1'=V_2'$.

According to some embodiments of this application, the calculating the value of the internal short-circuit resistance of the battery based on the discharge voltage drop equation includes:

obtaining a first discharge voltage drop $$\Delta V_1 = (V_0 + I_1 * R_{ISC})\frac{r}{r + R_{ISC}}$$

based on the discharge voltage drop equation; obtaining a second discharge voltage drop $$\Delta V_2 = (V_0 + I_2 * R_{ISC})\frac{r}{r + R_{ISC}}$$

based on the discharge voltage drop equation; and calculating a first ratio $$dV_{Ratio} = \frac{V_0 + I_2 * R_{ISC}}{V_0 + I_1 * R_{ISC}}$$

based on the first discharge voltage drop and the second discharge voltage drop, and calculating, based on the first ratio, the value of the internal short-circuit resistance of the battery to be $$R_{ISC} = \frac{dV_{Ratio} - 1}{I_2 - dV_{Ratio} * I_1} V_0.$$

An embodiment of this application provides an electronic apparatus, where the electronic apparatus includes: a battery; and a processor, configured to perform the foregoing method for detecting internal short circuit of a battery.

An embodiment of this application provides a storage medium, storing at least one computer instruction, where the computer instruction is loaded by a processor and is used to perform the foregoing method for detecting internal short circuit of a battery.

In the embodiments of this application, a voltage drop ratio of a battery under different discharge currents can be calculated, to determine whether the battery has an internal short circuit, and a value of an internal short-circuit resistance is calculated when it is determined that the battery has an internal short circuit. Not only whether the battery has internal short circuit can be accurately determined, but also the resistance of the short-circuit resistance can be accurately calculated. Therefore, internal short circuit of the battery can be detected as early as possible, ensuring safety of the electronic apparatus and the user.

REFERENCE SIGNS OF MAIN COMPONENTS

Electronic apparatus 100
Memory 11
Processor 12
Battery 13
Collection apparatus 14
Timer 15

This application is further described in detail in the following specific embodiments with reference to the accompanying drawings.

DETAILED DESCRIPTION

The following clearly describes the technical solutions in the embodiments of this application with reference to the accompanying drawings in the embodiments of this application. Apparently, the described embodiments are some but not all of the embodiments of this application.

Figure 1:
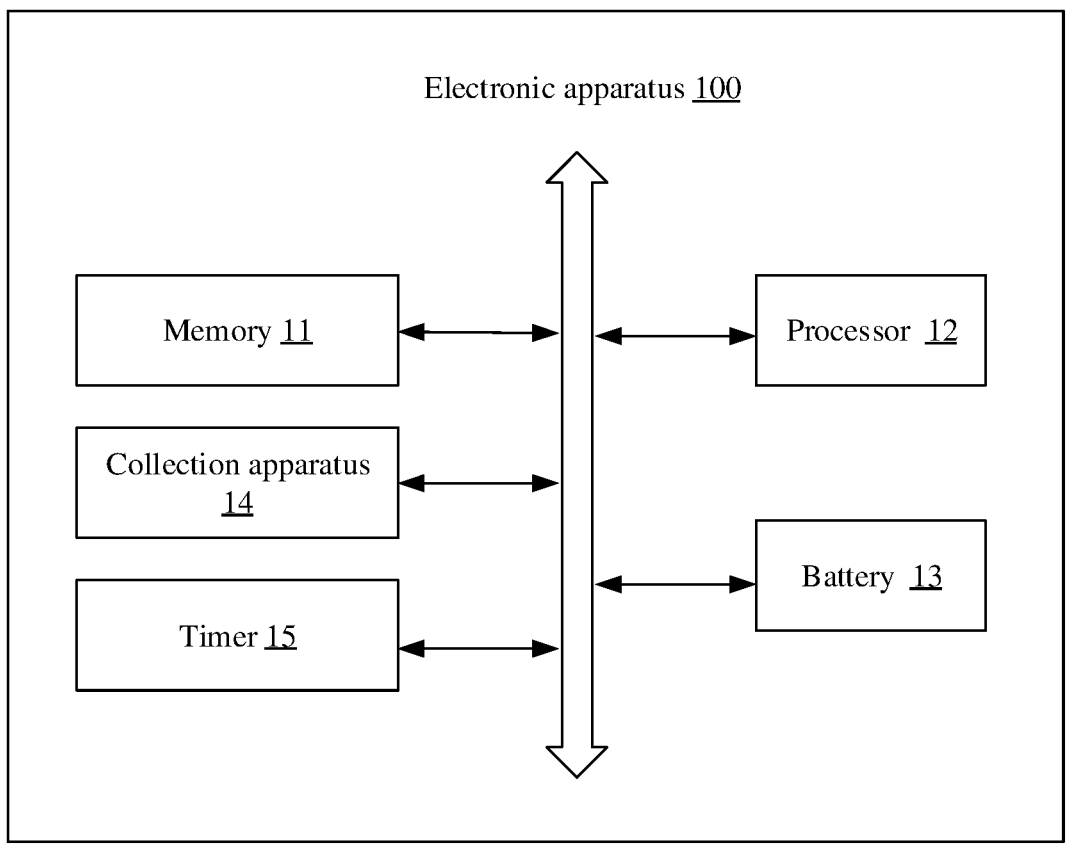
FIG. 1 is a schematic diagram of an electronic apparatus according to an embodiment of this application.

Referring to FIG. 1, FIG. 1 is a schematic diagram of an electronic apparatus according to an embodiment of this application. The electronic apparatus 100 includes but is not limited to a memory 11, at least one processor 12, a battery 13, a collection apparatus 14, and a timer 15. The components can be connected through a bus or directly connected.

It should be noted that the electronic apparatus 100 is used only as an example for description in FIG. 1. In another embodiment, the electronic apparatus 100 may alternatively include more or fewer elements, or have a different element configuration. The electronic apparatus 100 may be an electric motorcycle, an electric bicycle, an electric car, a mobile phone, a tablet computer, a personal digital assistant, a personal computer, or any other appropriate rechargeable device.

In an embodiment, the battery 13 is a rechargeable battery, and is configured to supply power to the electronic apparatus 100. For example, the battery 13 may be a lead-acid battery, a nickel-cadmium battery, a nickel-hydrogen battery, a lithium-ion battery, a lithium polymer battery, a lithium iron phosphate battery, or the like. The battery 13 is logically connected to the processor 12 through a battery management system (BMS), thereby implementing functions such as charging and discharging through the battery management system. The battery management system can communicate with a power conversion system (PCS) through CAN or RS485. The battery 13 includes a battery cell (not shown in the figure), and the battery can be recharged in a recyclable and rechargeable manner.

In this embodiment, the collection apparatus 14 is configured to collect a voltage of the battery 13 and a charging current of the battery 13. In this embodiment, the collection apparatus 14 is configured to collect a voltage of the battery cell of the battery 13 and a charging current of the battery cell of the battery 13. In this embodiment, the collection apparatus 14 is an analog-to-digital converter. It can be understood that the collection apparatus 14 may alternatively be another voltage collection apparatus or another current collection apparatus. The timer 15 is configured to record charging duration of the battery cell of the battery 13 in a charging process. It can be understood that the electronic apparatus 100 may also include another apparatus, such as a pressure sensor, a light sensor, a gyroscope, a hygrometer, and an infrared sensor.

Figure 2:
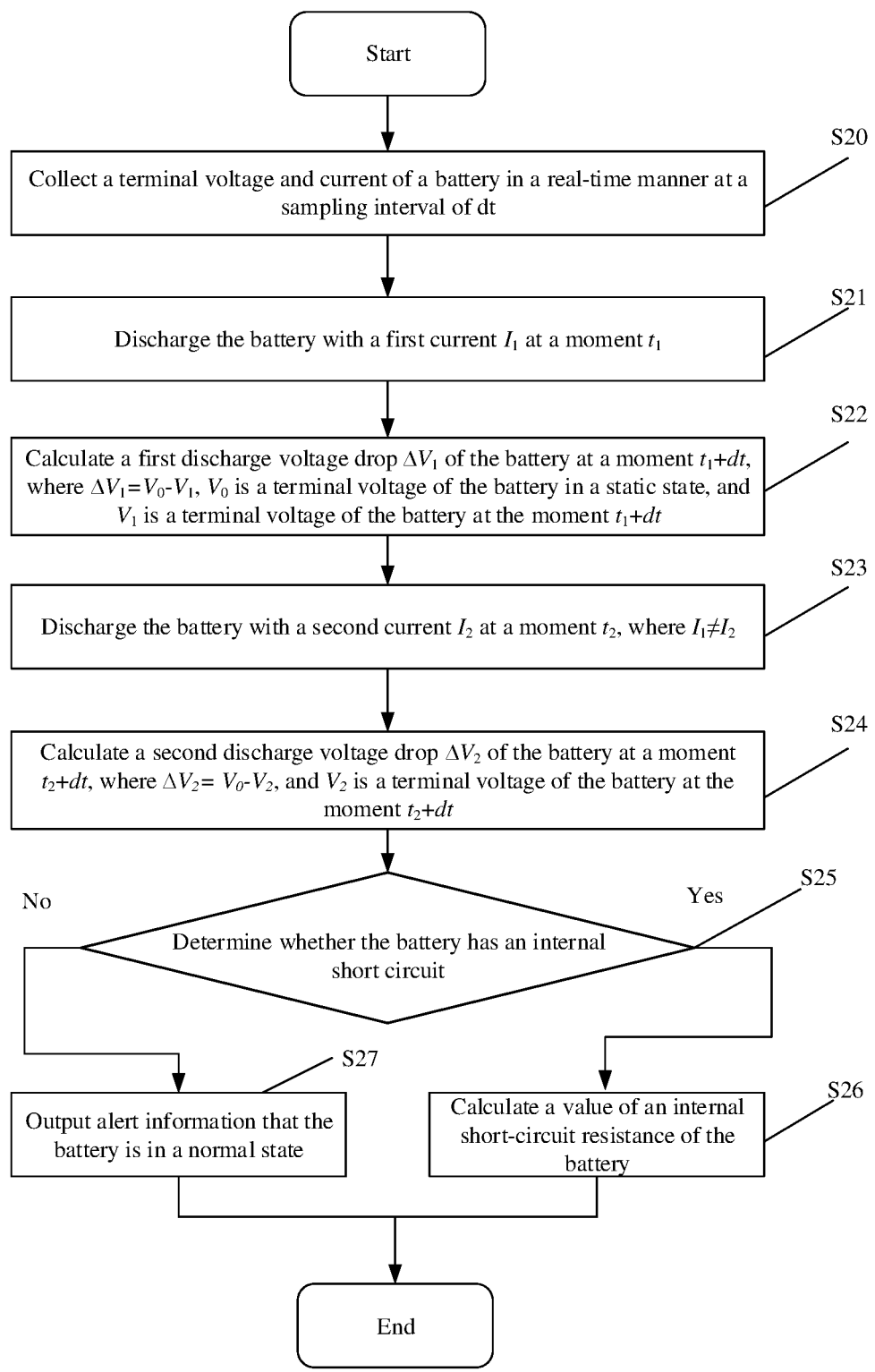
FIG. 2 is a flowchart of a method for detecting internal short circuit of a battery according to an embodiment of this application.

Referring to FIG. 2, FIG. 2 is a flowchart of a method for detecting internal short circuit of a battery according to an embodiment of this application. The method for detecting internal short circuit of a battery is applied to the battery. The method for detecting internal short circuit of a battery includes the following steps:

Step S20: Collect a terminal voltage and current of a battery in a real-time manner at a sampling interval of dt.

In this embodiment, in a battery operating process (for example, the charging or discharging process), the terminal voltage and current of the battery are collected by the collection apparatus 14 in a real-time manner at the sampling interval of dt. It should be noted that, when the battery is in a static state, the terminal voltage $V_0$ of the battery is first collected by the collection apparatus 14. In this case, an open-circuit voltage OCV of the battery may be used as the terminal voltage of the battery.

Step S21: Discharge the battery with a first current $I_1$ at a moment $t_1$.

In this embodiment, to determine whether the battery has internal short circuit in the operating process, a voltage drop ratio of the battery under different discharge currents needs to be calculated, and whether the battery has internal short circuit is determined based on the voltage drop ratio; and if it is determined that the battery has an internal short circuit, a value of an internal short-circuit resistance is calculated.

In an embodiment, the battery is impulsively discharged with the first current $I_1$ through a load at the moment $t_1$. It should be noted that, in another embodiment, the battery may also be constant-current discharged with the first current $I_1$.

Step S22: Calculate a first discharge voltage drop $\Delta V_1$ of the battery at a moment $t_1+dt$, where $\Delta V_1=V_0-V_1$, $V_0$ is the terminal voltage of the battery in a static state, and $V_1$ is a terminal voltage of the battery at the moment $t_1+dt$.

In this embodiment, after the battery is impulsively discharged with the first current $I_1$, the first discharge voltage drop $\Delta V_1$ of the battery at the moment $t_1+dt$ can be calculated. Specifically, the terminal voltage $V_1$ of the battery at the moment $t_1+dt$ is collected by the collection apparatus 14, and then the first discharge voltage drop $\Delta V_1=V_0-V_1$ of the battery at the moment $t_1+dt$ is obtained based on the terminal voltage $V_0$ of the battery in the static state.

Step S23: Discharge the battery with a second current $I_2$ at a moment $t_2$, where $I_1 \neq I_2$.

In this embodiment, to keep a depth of discharge (DOD) of the battery unchanged, the battery is impulsively discharged with the second current $I_2$ through the load at the moment $t_2$.

Step S24: Calculate a second discharge voltage drop $\Delta V_2$ of the battery at a moment $t_2+dt$, where $\Delta V_2=V_0-V_2$, and $V_2$ is a terminal voltage of the battery at the moment $t_2+dt$.

In this embodiment, after the battery is impulsively discharged with the second current $I_2$, the second discharge voltage drop $\Delta V_2$ of the battery at the moment $t_2+dt$ can be calculated. Specifically, the terminal voltage $V_2$ of the battery at the moment $t_2+dt$ is collected by the collection apparatus 14, and then the second discharge voltage drop $\Delta V_2=V_0-V_2$ of the battery at the moment $t_2+dt$ is obtained based on the terminal voltage $V_0$ of the battery in the static state.

Step S25: Determine, based on the first current $I_1$, the first discharge voltage drop $\Delta V_1$, the second current $I_2$, and the second discharge voltage drop $\Delta V_2$, whether the battery has internal short circuit. If the battery has an internal short circuit, the procedure proceeds to step S26; or if the battery has no internal short circuit, the procedure proceeds to step S27.

In this embodiment, a first ratio $dV_{Ratio}$ between the second discharge voltage drop $\Delta V_2$ and the first discharge voltage drop $\Delta V_1$ and a second ratio $dI_{Ratio}$ between the second current $I_2$ and the first current $I_1$ are calculated; and whether the battery has an internal short circuit is determined based on the first ratio $dV_{Ratio}$ and the second ratio $dI_{Ratio}$.

Specifically, if an absolute value of a difference between the first ratio $dV_{Ratio}$ and the second ratio $dI_{Ratio}$ is greater than a preset value, it is determined that the battery has an internal short circuit, and the procedure proceeds to step S26: calculate a value of the internal short-circuit resistance of the battery, and output alert information that the battery has an internal short circuit and the value of the internal short-circuit resistance; and if the first ratio $dV_{Ratio}$ is equal to the second ratio $dI_{Ratio}$, it is determined that the battery has no internal short circuit, and the procedure proceeds to step S27: output alert information that the battery is in a normal state.

It should be noted that, in an ideal case, if the first ratio $dV_{Ratio}$ is not equal to the second ratio $dI_{Ratio}$, it is determined that the battery has an internal short circuit. However, due to a sampling error, when the absolute value of the difference between the first ratio $dV_{Ratio}$ and the second ratio $dI_{Ratio}$ is greater than the preset value, it may be determined that the battery has an internal short circuit. Herein, the preset value may be 5% of the second ratio ($0.05 \times dI_{Ratio}$).

In another embodiment, if $$\frac{|dV_{Ratio} - dI_{Ratio}|}{dI_{Ratio}}$$

is greater than a threshold (for example, 5%), it can be determined that the battery has an internal short circuit.

Figure 3:
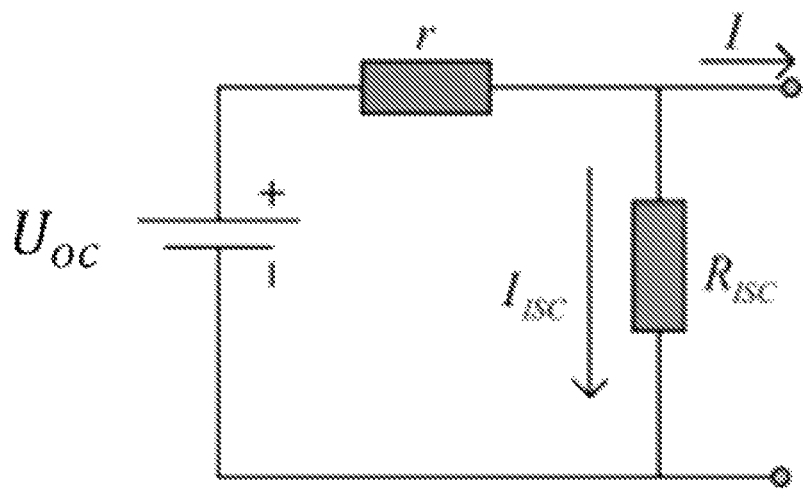
FIG. 3 shows an equivalent circuit model of a battery used when the battery has an internal short circuit.

In this embodiment, if it is determined that the battery has an internal short circuit, the value of the internal short-circuit resistance of the battery is calculated. Specifically, a method for calculating the value of the internal short-circuit resistance of the battery includes the following steps:

(a) Establish an equivalent circuit model of the battery. In this embodiment, the equivalent circuit model of the battery may be a Rint model, a Thevenin model, a PNGV model, a second-order RC model, or the like. In this embodiment, the equivalent circuit model of the battery is the Rint model. In the Rint model, a voltage response of the battery with an internal short circuit under a discharge condition may be simulated. Referring to FIG. 3, FIG. 3 is an equivalent circuit model of a battery used for calculation of a value of an internal short-circuit resistance of the battery. In FIG. 3, $R_{ISC}$ is the internal short-circuit resistance, $U_{oc}$ is an open-circuit voltage of the battery, r is an internal resistance of the battery, $I_{ISC}$ is a current flowing through the internal short-circuit resistance, and I is a current flowing through the internal resistance r of the battery.

(b) Calculate a first voltage $V_1'$ of the battery in the equivalent circuit model. In this embodiment, when the battery is in a state of discharge, the terminal voltage (that is, the first voltage $V_1'$) of the battery in the equivalent circuit model is calculated according to the Ohm's law and Kirchhoff's law. Because the internal resistance and the internal short-circuit resistance of the battery are connected in series, according to the Ohm's law, it can be learned that: $U_0=(I+I_{ISC}) \times r$, where $U_0$ is a voltage over two ends of the resistance of the battery, I is a current flowing through the internal resistance r of the battery, $I_{ISC}$ is a current flowing through the internal short-circuit resistance, and r is the internal resistance of the battery. The Kirchhoff's law includes: $\Sigma_{k=1}^{m} v_k=0$, where m is the number of components in a closed loop in the equivalent circuit model of the battery, and $v_k$ is a voltage over two ends of a component. It can be learned from this that $U_{oc}=V_1'+U_0$, and the first voltage $V_1'$ can be determined through a formula (1):

$$V_1'=U_{oc}-(I+I_{ISC}) \times r \qquad (1)$$

(c) Calculate a second voltage $V_2'$ over the internal short-circuit resistance in the equivalent circuit model. In this embodiment, it can be learned from the Ohm's law that the second voltage $V_2'$ over the internal short-circuit resistance in the equivalent circuit model may be determined through a formula (2).

$$V_2'=I_{ISC}=R_{ISC} \qquad (2)$$

(d) Obtain a discharge voltage drop equation based on the first voltage $V_1'$ and the second voltage $V_2'$. Because a partial voltage over two ends of the internal short-circuit resistance is the same as the first voltage of the battery, that is $V_1'=V_2'$, the discharge voltage drop is:

$\Delta V = U_{oc} - V_1'$ or $\Delta V = U_{oc} - V_2'$. Therefore, based on the formula (1), the formula (2), and the discharge voltage drop $\Delta V = U_{oc} - V_1'$, the discharge voltage drop equation may be determined as a formula (3):

$$\Delta V = (U_{oc} + I * R_{ISC}) \frac{r}{r + R_{ISC}} \quad (3)$$

(e) Calculate the value of the internal short-circuit resistance of the battery based on the discharge voltage drop equation.

In this embodiment, the first discharge voltage drop $\Delta V_1$ of the battery at the moment $t_1+dt$ is calculated based on the discharge voltage drop equation, the second discharge voltage drop $\Delta V_2$ of the battery at the moment $t_2+dt$ is calculated, the first ratio $$dV_{Ratio} = \frac{\Delta V_2}{\Delta V_1} = \frac{V_0 + I_2 * R_{ISC}}{V_0 + I_1 * R_{ISC}}$$

is calculated based on the first discharge voltage drop and the second discharge voltage drop, and the value of the internal short-circuit resistance can be calculated to be $R_{ISC}$ by rearranging the formula of the first ratio.

Specifically, the calculating the value of the internal short-circuit resistance of the battery based on the discharge voltage drop equation includes: obtaining a first discharge voltage drop $$\Delta V_1 = (V_0 + I_1 * R_{ISC}) \frac{r}{r + R_{ISC}}$$

based on the discharge voltage drop equation; obtaining a second discharge voltage drop $$\Delta V_2 = (V_0 + I_1 * R_{ISC}) \frac{r}{r + R_{ISC}}$$

based on the discharge voltage drop equation; calculating a first ratio $$dV_{Ratio} = \frac{V_0 + I_2 * R_{ISC}}{V_0 + I_1 * R_{ISC}}$$

based on the first discharge voltage drop and the second discharge voltage drop, and calculating, based on the first ratio, the value of the internal short-circuit resistance of the battery to be $$R_{ISC} = \frac{dV_{Ratio} - 1}{I_2 - dV_{Ratio} * I_1} V_0.$$

Figure 4:
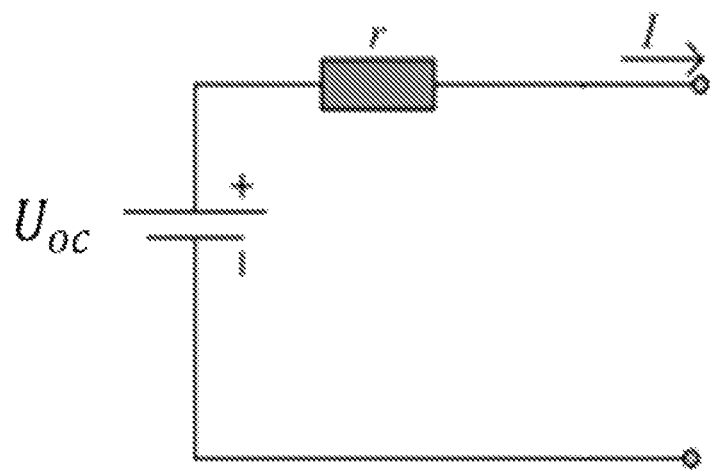
FIG. 4 shows an equivalent circuit model of a battery used when the battery has no internal short circuit.

It should be noted that another equivalent circuit model of the battery may be established for a battery with no internal short circuit. For example, a voltage response under a battery discharge condition is simulated in another Rint model shown in FIG. 4. In this case, the battery is a standard battery, that is, a battery with no internal short circuit. In FIG. 4, $U_{oc}$ is an open-circuit voltage of the battery, r is an internal resistance of the battery, I is a current flowing through the internal resistance r of the battery. When the battery is in a state of discharge, the terminal voltage of the battery is $V = U_{oc} - I \times r$, where $U_{oc}$ is the open-circuit voltage of the battery, and r is the internal resistance of the battery. $U_0$, $V_1$, and $I_1$ are separately substituted into a formula $V_1 = U_0 - I_1 \times r$ corresponding to the terminal voltage, the first discharge voltage drop $\Delta V_1 = U_0 - V_1 = I_1 \times r$ of the battery at the moment $t_1+dt$ can be obtained. Because the depth of discharge (DOD) of the battery at the moment $t_2$ remains unchanged, terminal voltages of the battery at the moment $t_2$ and the moment t1 are the same and both equal to $U_0$. Similarly, $V_2$ and $I_2$ are substituted into the formula $V_2 = U_0 - I_2 \times r$ corresponding to the terminal voltage, the second discharge voltage drop $\Delta V_2 = U_0 - V_2 = I_2 \times r$ at the moment $t_2+dt$ can be obtained; and therefore, the first ratio $$dV_{Ratio} = \frac{\Delta V_2}{\Delta V_1} = \frac{I_2}{I_1}$$

between the first discharge voltage drop and the second discharge voltage drop can be obtained. That is, the first ratio is equal to the second ratio. Therefore, it is determined that the battery has no internal short circuit under the condition that the first ratio is equal to the second ratio.

To make the objectives, technical solutions, and advantages of this application more comprehensible, the following further describes the method for detecting internal short circuit of a battery in this application in detail with reference to the accompanying drawings and embodiments. It should be understood that the specific embodiments described herein are merely used to explain this application but are not intended to limit this application.

In this embodiment, according to the procedure shown in FIG. 2, based on changes of a terminal voltage obtained in a real-time manner in a constant-current charging process of the battery, whether the battery has an internal short circuit is detected and the value of the internal short-circuit resistance is calculated. In this embodiment, a to-be-tested sample battery is a ternary lithium soft pack battery with a rated capacity of 4 Ah. In this embodiment, rated resistors with resistance values of 75 Ω, 150 Ω, 225Ω, and 750Ω are connected in parallel with three to-be-tested sample batteries respectively to simulate an internal short circuit of the battery, and the value of the internal short-circuit resistance is estimated based on the method for detecting internal short circuit of a battery in this application. Specifically, the method includes the following steps:

(1) In an operating process of the battery, obtain and record terminal voltage and current data of the battery in a real-time manner at a sampling interval of 1 s.

(2) Keep the battery in a static state and record the terminal voltage $V_0$ of the battery, where the terminal voltage of the battery may be used as an open-circuit voltage OCV of the battery in this case.

(3) Impulsively discharge the battery for 2 s through a load with a current $I_1$ of 2 A at a $10^{th}$ second, and record a first discharge voltage drop $\Delta V_1 = V_0 - V_1$ of the battery, where $V_1$ is a terminal voltage of the battery at an $11^{th}$ second.

(4) Keep a depth of discharge of the battery unchanged, impulsively discharge the battery for 2 s through a load with a current $I_2$ of 4 A at a moment of a $70^{th}$ second, and record a discharge voltage drop $\Delta V_2 = V_0 - V_2$ of the battery, where $V_2$ is a terminal voltage of the battery at a $71^{st}$ second.

(5) Calculate a ratio $$dV_{Ratio} = \frac{\Delta V_2}{\Delta V_1}$$

of the two discharge voltage drops, where if $dV_{Ratio}$ is equal to a ratio $I_2/I_1$ of the two discharge currents, the battery has no internal short circuit; or if $dV_{Ratio}$ is not equal to the ratio $I_2/I_1$ of the two discharge currents, the battery has an internal short circuit. Obviously, in this embodiment, $dV_{Ratio}$ is not equal to the ratio $I_2/I_1$ of the two discharge currents.

(6) If it is determined that the battery has an internal short circuit, calculate the value of the internal short-circuit resistance $$R_{ISC} = \frac{dV_{Ratio} - 1}{I_2 - dV_{Ratio} * I_1} V_0$$

Figure 5:
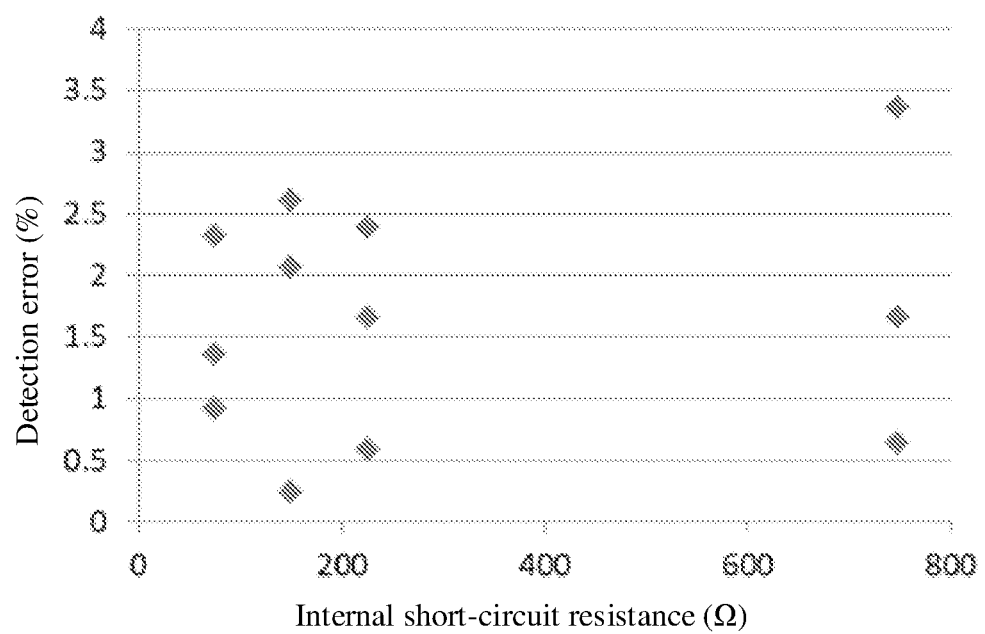
FIG. 5 is a schematic diagram of calculating a detection result of an internal short-circuit resistance of a battery based on a method for detecting internal short circuit of a battery according to an embodiment of this application.

It should be noted that the foregoing step (1) to step (6) describe a case that a rated resistor is connected in parallel with a to-be-tested sample battery to simulate an internal short circuit of the battery. Based on the method described in this embodiment, an internal short-circuit detection result of the battery is shown in FIG. 5. When the three to-be-tested sample batteries are separately connected in parallel with a 75Ω rated resistor to simulate an internal short circuit of the battery, a resistance value of the rated resistor is subtracted from the value of the internal short-circuit resistance that is calculated based on the method for detecting internal short circuit of a battery provided in this application to obtain a difference, and the difference is divided by the resistance value of the rated resistor to obtain a detection error. As shown in FIG. 5, when the to-be-tested sample batteries are separately connected in parallel with a 75Ω rated resistor to simulate an internal short circuit of the battery, calculated detection errors are approximately 1%, 1.49%, and 2.49% respectively. Likewise, a detection error for three to-be-tested sample batteries that are separately connected in parallel with a 150Ω rated resistor to simulate an internal short circuit of the battery, a detection error for three to-be-tested sample batteries that are separately connected in parallel with a 225Ω rated resistor to simulate an internal short circuit of the battery, and a detection error for three to-be-tested sample batteries that are separately connected in parallel with a 750Ω rated resistor to simulate an internal short circuit of the battery can be calculated. It can be learned from FIG. 5 that resistance values calculated when the three to-be-tested sample batteries are separately connected with different rated resistors to simulate an internal short circuit of the battery are not significantly different from the resistance values of the rated resistors. This verifies that the value of the internal short-circuit resistance calculated based on the method for detecting internal short circuit of a battery provided in this application when the battery has an internal short circuit is relatively highly accurate.

Further referring to FIG. 1, in this embodiment, the memory 11 may be an internal memory of the electronic apparatus, that is, a memory built in the electronic apparatus. In another embodiment, the memory 11 may alternatively be an external memory of the electronic apparatus, that is, a memory externally connected to the electronic apparatus.

In some embodiments, the memory 11 is configured to store program code and various data, and complete automatic high-speed access of the program and the data in an operating process of the electronic apparatus.

The memory 11 may include a random access memory, and may further include a non-volatile memory, for example, a hard disk, a memory, a plug-connected hard disk, a smart media card (SMC), a secure digital (SD) card, a flash card (Flash Card), at least one magnetic disk storage device, a flash memory device, or other volatile solid-state storage devices.

In an embodiment, the processor 12 may be a central processing unit (CPU), or may be another general-purpose processor, a digital signal processor (DSP), an application specific integrated circuit (ASIC), a field-programmable gate array (FPGA) or another programmable logic device, a discrete gate or transistor logic device, a discrete hardware component, or the like. The general-purpose processor may be a microprocessor, or the processor may be any other conventional processor or the like.

When the program code and various data in the memory 11 are implemented in a form of a software functional unit and sold or used as an independent product, the program code and various data may be stored in a computer-readable storage medium. Based on such understanding, some or all of the processes for implementing the methods in the embodiments of this application may be completed by related hardware instructed by a computer program, for example, a step for implementing the method for detecting internal short circuit of a battery. The computer program may be stored in a computer-readable storage medium. When the computer program is executed by the processor 12, the steps of the foregoing method embodiments are implemented. The computer program includes computer program code, and the computer program code may be in a form of source code, object code, or an executable file, some intermediate forms, or the like. The computer-readable medium may include: any entity or apparatus capable of carrying the computer program code, a recording medium, a USB flash drive, a removable hard disk, a magnetic disk, an optical disc, a computer memory, a read-only memory (ROM), or the like.

It can be understood that division of modules described above is division of logical functions. Other division manners may be available in actual implementation. In addition, function modules in the embodiments of this application may be integrated into a same processing unit, or each of the modules may exist alone physically, or two or more modules are integrated into a same unit. The integrated module may be implemented in a form of hardware, or may be implemented in a form of hardware and a software functional module.

Eventually, it should be noted that the foregoing embodiments are merely intended to describe the technical solutions of this application, but not intended to constitute any limitation. Although this application is described in detail with reference to preferred embodiments, a person of ordinary skill in the art should understand that modifications or equivalent replacements can be made to the technical solutions of this application, without departing from the spirit and scope of the technical solutions of this application.

What is claimed is:

1. A method for detecting internal short circuit of a battery, wherein the method comprises:

discharging the battery with a first current $I_1$ at a moment $t_1$;

calculating a first discharge voltage drop $\Delta V_1$ of the battery at a moment $t_1+dt$, wherein $\Delta V_1=V_0-V_1$, $V_0$ is a terminal voltage of the battery in a static state, and $V_1$ is a terminal voltage of the battery at the moment $t_1+dt$;

discharging the battery with a second current $I_2$ at a moment $t_2$, wherein $I_1 \neq I_2$;

calculating a second discharge voltage drop $\Delta V_2$ of the battery at a moment $t_2+dt$, wherein $\Delta V_2=V_0-V_2$, and $V_2$ is a terminal voltage of the battery at the moment $t_2+dt$; and determining, based on the first current $I_1$, the first discharge voltage drop $\Delta V_1$, the second current $I_2$, and the second discharge voltage drop $\Delta V_2$, whether the battery has an internal short circuit.

2. The method for detecting internal short circuit of a battery according to claim 1, wherein the method further comprises:

calculating a first ratio $dV_{Ratio}$ between the second discharge voltage drop $\Delta V_2$ and the first discharge voltage drop $\Delta V_1$ and a second ratio $dI_{Ratio}$ between the second current $I_2$ and the first current $I_1$; and if an absolute value of a difference between the first ratio $dV_{Ratio}$ and the second ratio $dI_{Ratio}$ is greater than a preset value, outputting alert information that the battery has an internal short circuit.

3. The method for detecting internal short circuit of a battery according to claim 1, wherein the method further comprises:

if the battery has an internal short circuit, calculating a value of an internal short-circuit resistance of the battery.

4. The method for detecting internal short circuit of a battery according to claim 3, wherein the calculating the value of the internal short-circuit resistance of the battery comprises:

establishing an equivalent circuit model of the battery, and determining a first voltage $V_1'$ of the battery in the equivalent circuit model;

calculating a second voltage $V_2'$ over the internal short-circuit resistance in the equivalent circuit model;

obtaining a discharge voltage drop equation based on the first voltage $V_1'$ and the second voltage $V_2'$; and calculating the value of the internal short-circuit resistance of the battery based on the discharge voltage drop equation.

5. The method for detecting internal short circuit of a battery according to claim 4, wherein the first voltage $V_1'$ is determined through the following formula:

$$V_1'=U_{oc}-(I+I_{ISC})\times r,$$

wherein $U_{oc}$ is an open-circuit voltage of the battery, r is an internal resistance of the battery, $I_{ISC}$ is a current flowing through the internal short-circuit resistance, and I is a current flowing through the internal resistance of the battery.

6. The method for detecting internal short circuit of a battery according to claim 5, wherein the second voltage $V_2'$ is determined through the following formula:

$$V_2'=I_{ISC} \times R_{ISC},$$

wherein $R_{ISC}$ is the value of the internal short-circuit resistance.

7. The method for detecting internal short circuit of a battery according to claim 6, wherein the discharge voltage drop equation is determined through the following formula:

$$\Delta V = (U_{oc} + I * R_{ISC})\frac{r}{r + R_{ISC}}$$

wherein $\Delta V = U_{oc} - V_1'$ and $V_1' = V_2'$.

8. The method for detecting internal short circuit of a battery according to claim 7, wherein the calculating the value of the internal short-circuit resistance of the battery based on the discharge voltage drop equation comprises:

obtaining a first discharge voltage drop $$\Delta V_1 = (V_0 + I_1 * R_{ISC})\frac{r}{r + R_{ISC}}$$

based on the discharge voltage drop equation;

obtaining a second discharge voltage drop $$\Delta V_2 = (V_0 + I_1 * R_{ISC})\frac{r}{r + R_{ISC}}$$

based on the discharge voltage drop equation; and calculating a first ratio $$dV_{Ratio} = \frac{V_0 + I_2 * R_{ISC}}{V_0 + I_1 * R_{ISC}}$$

based on the first discharge voltage drop and the second discharge voltage drop, and calculating, based on the first ratio, the value of the internal short-circuit resistance of the battery to be $$R_{ISC} = \frac{dV_{Ratio} - 1}{I_2 - dV_{Ratio} * I_1} V_0.$$

9. An electronic apparatus, wherein the electronic apparatus comprises:

a battery; and a processor, configured to perform a method for detecting internal short circuit of the battery that comprises:

discharging the battery with a first current $I_1$ at a moment $t_1$;

calculating a first discharge voltage drop $\Delta V_1$ of the battery at a moment $t_1+dt$, wherein $\Delta V_1=V_0-V_1$, $V_0$ is a terminal voltage of the battery in a static state, and $V_1$ is a terminal voltage of the battery at the moment $t_1+dt$;

discharging the battery with a second current $I_2$ at a moment $t_2$, wherein $I_1 \neq I_2$;

calculating a second discharge voltage drop $\Delta V_2$ of the battery at a moment $t_2+dt$, wherein $\Delta V_2=V_0-V_2$, and $V_2$ is a terminal voltage of the battery at the moment $t_2+dt$; and determining, based on the first current $I_1$, the first discharge voltage drop $\Delta V_1$, the second current $I_2$, and the second discharge voltage drop $\Delta V_2$, whether the battery has an internal short circuit.

10. A non-transitory storage medium, storing at least one computer instruction, wherein the instruction is loaded by a processor and is used to perform a method for detecting internal short circuit of a battery that comprises:

discharging the battery with a first current $I_1$ at a moment $t_1$;

calculating a first discharge voltage drop $\Delta V_1$ of the battery at a moment $t_1+dt$, wherein $\Delta V_1=V_0-V_1$, $V_0$ is a terminal voltage of the battery in a static state, and $V_1$ is a terminal voltage of the battery at the moment $t_1+dt$;

discharging the battery with a second current $I_2$ at a moment $t_2$, wherein $I_1 \neq I_2$;

calculating a second discharge voltage drop $\Delta V_2$ of the battery at a moment $t_2+dt$, wherein $\Delta V_2=V_0-V_2$, and $V_2$ is a terminal voltage of the battery at the moment $t_2+dt$; and determining, based on the first current $I_1$, the first discharge voltage drop $\Delta V_1$, the second current $I_2$, and the second discharge voltage drop $\Delta V_2$, whether the battery has an internal short circuit.

\* \* \* \* \*